(12) United States Patent
Sri-Jayantha et al.

(10) Patent No.: US 11,545,415 B2
(45) Date of Patent: Jan. 3, 2023

(54) PRESSURE CONTROLLABLE ENCAPSULATED LIQUID THERMAL INTERFACE

(71) Applicant: International Business Machines Corporation, Armonk, NY (US)

(72) Inventors: Sri M. Sri-Jayantha, Ossining, NY (US); Gerard McVicker, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 346 days.

(21) Appl. No.: 16/716,367

(22) Filed: Dec. 16, 2019

(65) Prior Publication Data

US 2021/0183742 A1 Jun. 17, 2021

(51) Int. Cl.
*F28F 7/00* (2006.01)
*H01L 23/473* (2006.01)
(Continued)

(52) U.S. Cl.
CPC .......... *H01L 23/473* (2013.01); *H01L 23/373* (2013.01); *H01L 23/4332* (2013.01)

(58) Field of Classification Search
CPC .. H01L 23/473; H01L 23/373; H01L 23/4332
(Continued)

(56) References Cited

U.S. PATENT DOCUMENTS 6,127,832 A * 10/2000 Comulada, Jr. .... G01R 1/06705
324/755.07
7,312,527 B2 12/2007 Sane et al.
(Continued)

FOREIGN PATENT DOCUMENTS

CN 205921051 2/2017

OTHER PUBLICATIONS

Kaur, S. , Raravikar, N., Helms, B.A. et al. (2014) "Enhanced thermal transport at covalently functionalized carbon nanotube array interfaces". Nature communications, 5, p. 3082.
(Continued)

*Primary Examiner* — Claire E Rojohn, III
(74) *Attorney, Agent, or Firm* — Daniel P. Morris; Erik Johnson; Lou Percello, Attorney, PLLC

(57) ABSTRACT

Heat is transferred to a cold plate from one or more subassemblies in an array of subassemblies in an electronic package. The cold plate has a thermally conductive cold plate substrate, a pressure header, a pressure passage, and one or more pressure connections. Each of the pressure connections connects through a housing opening to housing volume defined by a flexible housing in an encapsulated liquid thermal interface (LTI). The flexible housing is in physical and thermal contact with one of the subassemblies through a housing bottom and a top surface of one or more components in the subassembly. A thermally conductive fluid fills the housing volume, housing opening, pressure connections, pressure passage, and pressure header which are all in fluid communication along with one or more other connections, housing openings, and LTIs on other subassemblies. The system transfers heat from the subassemblies to the cold plate while maintaining a constant pressure/stress on each of the subassemblies. The system pressure on each of the subassemblies is equal. The system pressure can be controlled to a preloaded pressure to insure good electrical contact between components. Shear on the subassemblies is minimized by the LTIs.

16 Claims, 9 Drawing Sheets

(51) Int. Cl.
*H01L 23/433* (2006.01)
*H01L 23/373* (2006.01)

(58) Field of Classification Search
USPC ........................................................ 165/80.4
See application file for complete search history.

(56) References Cited

U.S. PATENT DOCUMENTS

| | | | |
|---|---|---|---|
| 7,982,478 B2 | 7/2011 | Abazarnia et al. | |
| 8,002,025 B2 | 8/2011 | Audette et al. | |
| 8,806,742 B2 | 8/2014 | Cohen et al. | |
| 9,269,603 B2 | 2/2016 | Guerin et al. | |
| 9,377,486 B2 | 6/2016 | Song et al. | |
| 2006/0098399 A1* | 5/2006 | Sri-Jayantha | G06F 1/187 |
| 2007/0070605 A1* | 3/2007 | Straznicky | H05K 7/1461 |
| | | | 257/E23.098 |
| 2008/0225488 A1* | 9/2008 | Khanna | H01L 23/433 |
| | | | 257/E23.09 |
| 2009/0169886 A1* | 7/2009 | Hougham | B32B 37/144 |
| | | | 219/121.64 |
| 2010/0044856 A1* | 2/2010 | Sri-Jayantha | H01L 25/0657 |
| | | | 257/E23.101 |
| 2011/0108316 A1* | 5/2011 | Hougham | H05K 1/11 |
| | | | 430/311 |
| 2015/0000097 A1* | 1/2015 | Sri-Jayantha | B23P 15/26 |
| | | | 29/428 |
| 2016/0044824 A1* | 2/2016 | North | B23P 15/26 |
| | | | 29/890.03 |
| 2018/0061270 A1* | 3/2018 | Chainer | G06Q 10/087 |
| 2018/0076113 A1* | 3/2018 | Brunschwiler | H01L 24/32 |
| 2021/0183742 A1* | 6/2021 | Sri-Jayantha | H01L 23/473 |

OTHER PUBLICATIONS

Tao, Y., Malshe, A. P., & Brown, W. D. (2004). "Selective bonding and encapsulation for wafer-level vacuum packaging of MEMS and related micro systems". Microelectronics Reliability, 44(2), pp. 251-258.

* cited by examiner

PRESSURE CONTROLLABLE ENCAPSULATED LIQUID THERMAL INTERFACE

BACKGROUND

The present invention relates to cooling packages of arrays of load sensitive subassemblies/modules containing electronic components. More specifically, the invention relates to cooling load sensitive electronic subassemblies/components in packages to minimize thermal and mechanical stresses.

New computer systems are expected to have an array of replicated electronic subassemblies/modules of components packaged together. Array packaging allows a single cooling component such as a cold plate to be deployed to reduce the cost of cooling multiple components in an array.

However, even though subassemblies may be replicas of one another, variations in dimensions and materials of components in the subassemblies and operational variations of the components and subassemblies cause differences in heat generation, heat flux, heat removal, and temperature related to these subassemblies/components. As such, thermal and mechanical stresses and strains are introduced that can affect each of the components and subassemblies differently. These stresses and strains can diminish performance of these systems and lead to component and/or subassembly failure. Further, differential heating of the components/subassemblies make system design and operation more difficult because conditions that permit good operation of one component/subassembly can cause deterioration in another component/subassembly.

Particularly, optomechanical assemblies that provide high speed communication links between multiple processors use these packaging concepts. Since optical components are sensitive to operating temperature as well to mechanical misalignment, managing the thermal as well as mechanical load becomes of paramount importance in these packages.

There is a need for an array packaging cooling system which minimizes mechanical, heating, and temperature fluctuations and the commensurate stresses and strains due to manufacturing and operational variations of components in these packages.

SUMMARY

According to an embodiment of the present invention, heat is transferred to a cold plate from one or more subassemblies in an array of subassemblies in an electronic package. The cold plate has a thermally conductive cold plate substrate, a pressure header, a pressure passage, and one or more pressure connections.

The pressure connections connect to an encapsulated liquid thermal interface (LTI) through a housing opening. The LTI has a flexible housing with a housing volume. The housing opening opens to the housing volume. The flexible housing is in physical and thermal contact with one of the subassemblies through the housing bottom and a top surface of one or more components in the subassembly.

The housing volume is full of a thermally conductive fluid. The thermally conductive fluid also fills the housing opening, the pressure connections, pressure passage, and pressure header which are all in fluid communication along with one or more other pressure connections, housing openings, and LTIs on other subassemblies. This thermally conductive fluid connecting all the LTIs in the array of subassemblies has a system pressure.

The system transfers heat from the subassemblies to the cold plate while maintaining a constant pressure/stress on each of the subassemblies. All the subassemblies experience the same pressure/stress which equals the system pressure. The system pressure can be controlled to a selected pressure set point. Preloading the assemblies to a preload pressure insures good electrical contact between components. Shear on the subassemblies is minimized by the LTIs. Methods of controlling stress and strain in a package of subassemblies are disclosed.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
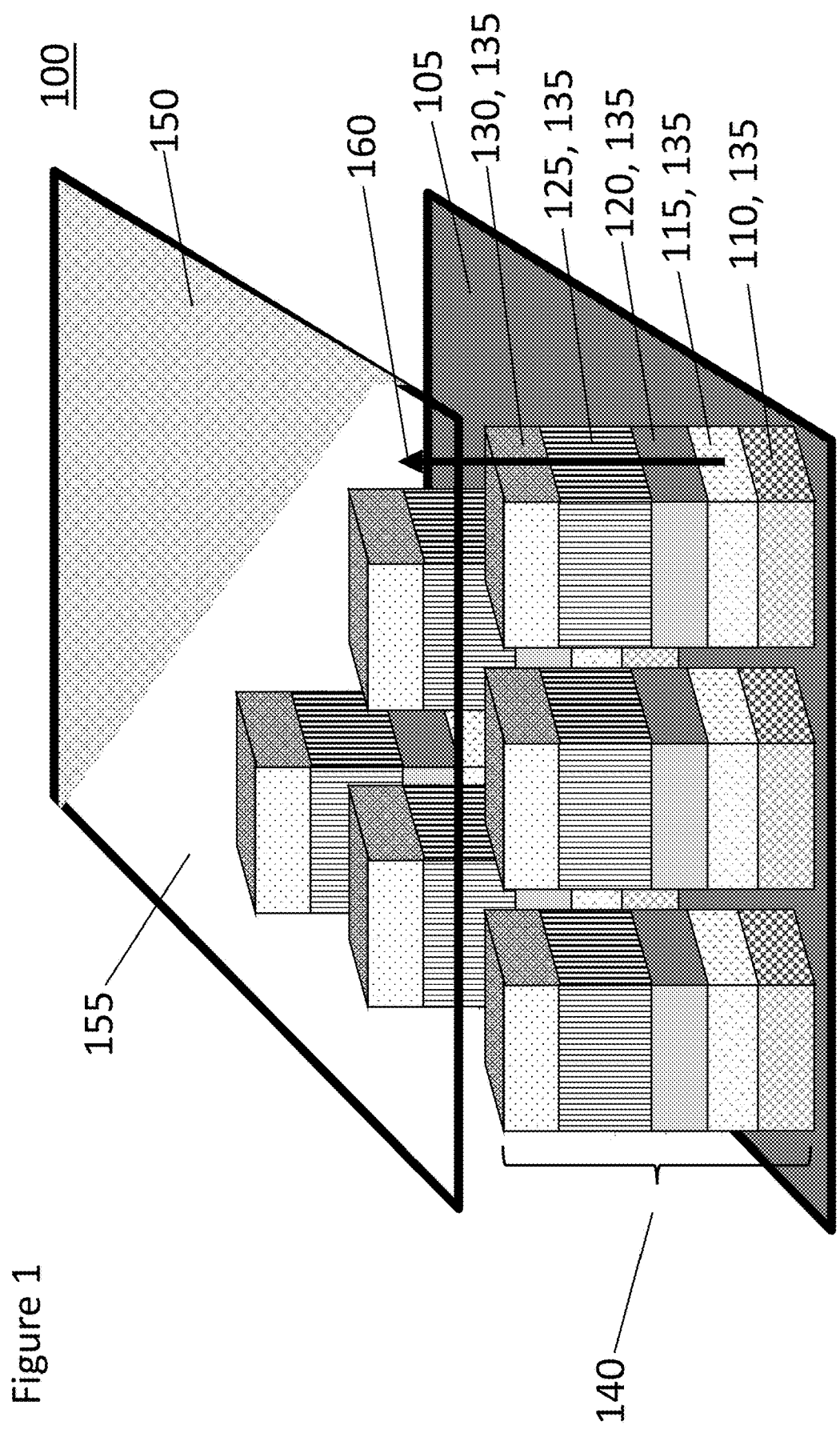
FIG. 1 is an isometric view of one embodiment of a cold plate cooled electronic package (package) having a plurality of subassemblies, with each subassembly having a plurality of components.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

FIG. 1 is an isometric view of one embodiment of a cold plate 150 cooled electronic package (package) 100 having a plurality of subassemblies/modules 140, with each subassembly 140 having a plurality of components (110, 115, 120, 125, 130, typically 135).

Each subassembly 140 consists of multiple layers of material representative of component 135 technology supporting, for example, electro-optic communications.

Some of the components 135 are electrically and/or optically interconnected and/or connect to the bottom substrate 105. In some embodiments, connections are made through a micro land grid array (uLGA) instead of traditional ball grid array (BGA). In some embodiments, uLGAs are used because solder reflow temperature is too high for some of the devices/components 135 embedded in a subassembly 140. Another reason is that uLGAs enable easier field replaceability for failed parts or modules. Preferably, uLGAs require a steady vertical force through the subassembly 140 to preload a good contact with the connections on the uLGA.

In some embodiments, the bottom component 135 of the subassembly 140 is an organic substrate (e.g. an FR4 component 110). A processor component 115 is disposed on and can be electrically connected to connections on and through the FR4 component 110. A metal plate (component) 120 is disposed on the processor component 115. A temperature and strain sensitive component 125 is disposed on the metal plate 120. A thermal interface material (TIM) 130 component is disposed on the temperature and strain sensitive component 125. The TIM 130 has a first (bottom) side thermally and physically connected to the temperature and strain sensitive component 125 (and through component 125 to the rest of the subassembly 140) and a second (top) side thermally and physically connected to the cold plate 150.

The cold plate 150 is shown in cut away view 155 so the subassemblies 140 are visible in FIG. 1. In the package 100, there can be a plurality of subassemblies 140 that are identical, similar, or different in structure.

The FR4 110 component 135 is typically a composite material, e.g., a laminate material like a glass-reinforced epoxy laminate, specifically a woven fiberglass cloth with an epoxy resin binder. The material is usually flame resistant/retardant (FR), strong, an electrical insulator, and non-moisture absorbent. The FR4 110 component 135 is disposed on the substrate 105.

The processor component 115 can be any semiconductor device and typically is the component that generates the heat. In typically subassemblies 140, the processor component 115 can generate 0.5 watt to 1.5 watts.

Electrical connections on the processor 115 can connect to connections on the FR4 110 and/or through the FR4 110 to connections on and/or within the substrate 105.

In some embodiments, the substrate 105 is a hard, rigid material. The substrate 105 can be crystalline, semi-crystalline, microcrystalline, or amorphous. The substrate 105 can be essentially (e.g., except for contaminants) a single element (e.g., silicon), primarily (e.g., with doping) of a single element, for example, silicon (Si) or germanium (Ge), or the substrate 105 can include a compound, for example, Al2O3 (Alumina), SiO2, GaAs, SiC, or SiGe. The substrate 105 can also have multiple material layers. In some embodiments, the substrate 105 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 105. In some embodiments, the substrate 105 includes both semiconductor materials and dielectric materials.

The metal plate 120 is physically and thermally connected to the processor component 115 (typically to the top of the processor 115) and provides good heat conduction from the processor 115. The metal plate also provides a rigid base of support for the temperature and strain sensitive 125 component 135 which is disposed on the metal plate 120. The metal plate 120 can be made of any heat conducting material including Copper (Cu), Aluminum (Al), Tungsten (W), Gold (Au), Silver (Ag), Nickel (Ni), etc.

The temperature and strain sensitive 125 component, for example, can be an optical module that would direct a light beam from an external device to a photosensitive element situated on the computer system board.

The thermal interface material (TIM) 130 component 135 is disposed on the temperature and strain sensitive 125 component and provides a physical and thermal connection to the cold plate 150. Heat flux 160 moves from the processor 115 through the metal plate 120, temperature and strain sensitive 125 component 135, and the TIM 130 component 135 to the cold plate 150. In some embodiments the TIM material is a grease, adhesive, or a gel that can cure during package 100 and/or subassembly 140 assembly.

Figure 2:
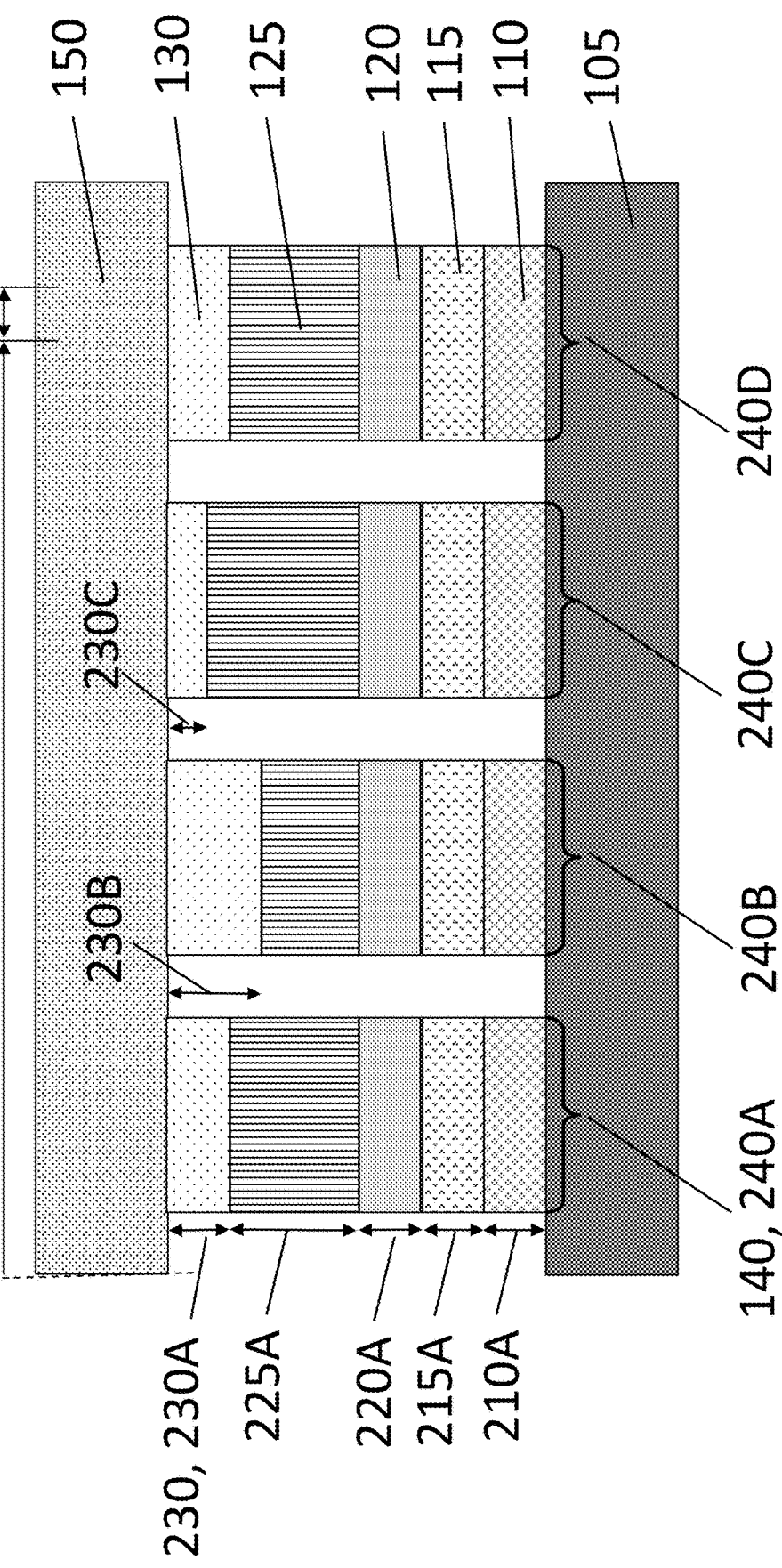
FIG. 2 is a block diagram illustration of a package showing variations of component thicknesses and properties in the subassemblies.

FIG. 2 is a block diagram illustration of a package 200 showing variations of components 135 in the subassemblies 140.

FIG. 2 shows a selected subset of the subassemblies/modules (240A, 240B, 240C, and 240D), typically 140. In some embodiments, the subassemblies 140 are mass produced at moderate costs resulting sometimes in a marginal mechanical height tolerance. For example, in some embodiments, a subassembly 140 of total height of 8 millimeters (mm), might have a height variation of +/−0.5 mm. A height variation of this percentage (5% or more) can affect the heat flux 160 and substantially change the operating temperature of a subassembly 140, e.g. even for heat generation in the processor 115 of about 1 watt or less.

Variations in other physical properties of the components 135 exist, i.e., each component 135 has a different thermal conductivity, k, and coefficient of linear thermal expansion, CTE. The material thermal conductivity, k, affects the heat flow per area with respect to time through a material surface for a given temperature difference across the surface. The coefficient of linear thermal expansion, CTE, affects the dimensional expansion (contraction), e.g. change in size, of a material with change in temperature.

A substrate 105 material like Alumina has a k=27 and a CTE=8. The FR4 component 110 can have a k=0.3 and a CTE=18. A processor component 115, made primarily of silicon, can have a k=163 and a CTE=4. The metal component 120 can have a k=400 and a CTE=17. The temperature and strain sensitive 125 component 135 can have a typical k=120 and a CTE=4. The TIM 130 component 135 can have a k=4 and a CTE=4. The cold plate 150 can have a k=45 and a CTE=12. Values given are for illustration, are approximate, and can vary with material type, homogeneity of the material, temperature, and other factors.

Thickness of a material/component 135 also affects heat flow.

Generally, the larger the k of a material, the greater the heat flow through the material, assuming other factors are constant. Also, the larger the CTE of a material, the larger the expansion/contraction of the material (change in thickness and/or length) with temperature change, assuming other factors are constant.

The TIM component 130 and the FR-4 component 110 typically have the lowest k values in a subassembly 140. Since most of the heat flow 160 passes from the processor component 115 to the cold plate 150, e.g. upwards, the TIM component 130 is the component 135 with the largest effect on heat flow 160 from the processor 115 to the cold plate 150, for given component 135 thicknesses. In addition, changes in the thickness (230A, 230B, 230C) of the TIM component 130 typically will cause the largest variation of heat flow in a subassembly 140, as compared to thickness changes of other components 135 in the subassembly 140.

Accordingly, if a first thickness 230A of the TIM 130 in a first subassembly 240A is different than a second thickness 230C of the TIM 130 in a second subassembly 240C, the heat flow 160 through the first subassembly 240A can be different than the heat flow 160 through the second subassembly 240C. The differences in heat flow 160 through the different subassemblies 140 result from different temperature gradients in the different subassemblies 140 in the direction from the substrate 105 to the cold plate 150. Since the components 135 in each of the subassemblies 140 have different temperature differences across them, the components 135 will expand different amounts. The components 130 with the highest CTE in the heat flow 160 path between the processor 115 and the cold plate 150 are the metal 120 and the TIM 130. Therefore, the metal 120 and TIM 130 can have the greatest effect on the differential expansion/contraction between subassemblies 140. The other components 135 still have some effect.

The differential expansion/contraction between subassemblies 140 is made worse because the thicknesses of the components 135 varies due to fabrication tolerances. For example, in subassembly 240A, while the FR4 110 thickness 210A, the processor 115 thickness 215A, and the metal 120 thickness 220A can be controlled to be the same or similar to the respective components 135 in other subassemblies 140, there are thickness variation in the temperature and strain sensitive 125 and TIM 130 components 135 across subassemblies.

For example, the TIM 130 thickness 230B in subassembly 240B is shown thicker than the TIM 130 thickness 230C in subassembly 240C. Other factors being equal, e.g. the thicknesses (210B, 215B, and 220B) and materials of subassembly 240B being equal to the thicknesses (210C, 215C, and 220C) and materials of subassembly 240C, subassembly 240B compared to subassembly 240C would have a more restricted heat flow 160, a higher temperature, and more elongation due to the thicker (230B) TIM 130. (Note that for clarity most of the thickness reference numbers for assemblies 140 are omitted but would correspond to the reference numbers used in assembly 240A).

These elongations/contractions of the subassemblies cause stresses (a compression force per cross-section area, where the force is perpendicular to the cross-section area) on the subassemblies 140. Because of the differential heating primarily caused by changes in thickness (e.g. 230A, 230B, and 230C) of the TIM 130, these stresses will differ from subassembly 140 to subassembly 140. These differential stresses and differential temperatures cause failures like component cracking, contact disconnections, etc.

In addition, the cold plate 150 is expanding/contracting 255 in horizontal directions "L" 250 along the surface of the cold plate 150, both along direction L within the plane of FIG. 2 and into/out of the plane of FIG. 2. These expansions/ contractions 255 cause shear (force per cross-section area, where the force is parallel to the cross-section area) at the interface of the cold plate 150 and the TIM 130. The shear tends to distort the TIM 130 and the rest of the components 135 in each of the subassemblies. To some extent the differential temperatures at the interface of the TIM 130 and cold plate 150 (e.g. temperature differences in the plane of the cold plate 150) can cause some shear differences experienced by each of the subassemblies 140.

To further illustrate the problems associated with array packaging, the TIM 130, such as a thermal pad (k=4), can produce a thermal variation from subassembly 140 to subassembly 140. In addition, the physical size "L" 250 of the package 200 (e.g. 30-60 mm) can produce significant in-plane (plane of the cold plate 150) expansion due to CTE of the cold plate 150 and the bottom substrate 105. The differential thermomechanical motion of each subassembly 140 can lead to unpredictable strain distribution across the array 200 depending on the TIM 130 thickness (e.g., 230A, 230B, 230C) and subassembly 140 location.

Figure 3:
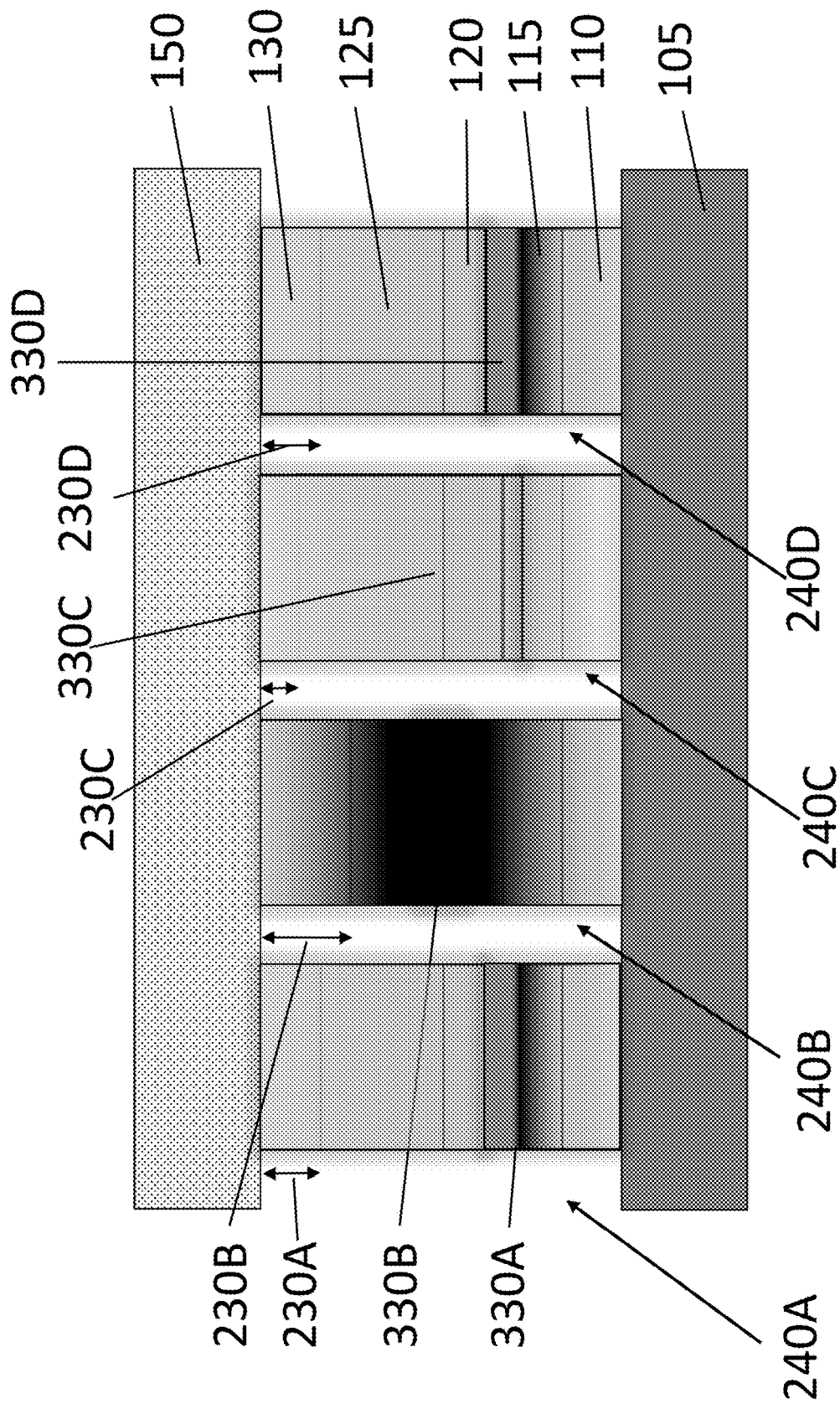
FIG. 3 is a block diagram illustration of a package showing thermal variability in subassemblies due to component variations, particularly variations in thermal interface material (TIM) component thickness.

FIG. 3 is a block diagram illustration of a package 300 showing thermal variability in subassemblies 140 due to component 135 variations, particularly variations in thermal interface material (TIM) 130 thickness (e.g. 230A, 230B, 230C, and 230D) variations.

Subassemblies 240A and 240D have TIMs 130 of approximately the same thicknesses (230A and 230D, respectively). The respective temperature profile or temperature gradients, 330A and 330D, respectively, of subassemblies 240A and 240 D are about the same. For each subassembly 240A and 240B, the concentration of higher temperatures (darker region) is within and around the processor 115 with the temperatures constant, uniform, and lower (uniform lighter grey regions) outside of the processor 115 region.

Subassembly 240C has a TIM 130 with the smallest thickness 230C and a cooler processor 115 region (less darkness) with a constant, uniform temperature (lighter grey) elsewhere in the subassembly 240C.

However, subassembly 240B has a TIM 130 with the largest thickness 230B. This subassembly 240B has higher temperatures in the processor 115 and in components outside the processor 115, e.g. in the metal 120, the temperature and strain sensitive 125 components 135, and into the TIM 130.

The package 300 shows how the different TIM 130 thickness (230A, 230B, 230C, and 230D) of the respective subassemblies 140 affect the temperature distribution/gradient in the subassemblies 140 in the direction from the substrate 105 to the cold plate 150. For example, the difference between the temperature gradients 330B and 330C, i.e. the temperature differentials between subassemblies 240B and 240C, respectively, cause differential expansion between the subassemblies, 240B and 240C. Since the components 135 of subassembly 240B are hotter, subassembly 240B will elongate/contract more than subassembly 240C during the same operational cycles. Accordingly, subassembly 240B will have higher stresses and will be more prone to failures and a shorter lifetime. Testing results indicate that temperature differentials in typical subassemblies 140 can be as great as 5 degrees Celsius or higher for a 1 watt power output by the processor 115.

Figure 4:
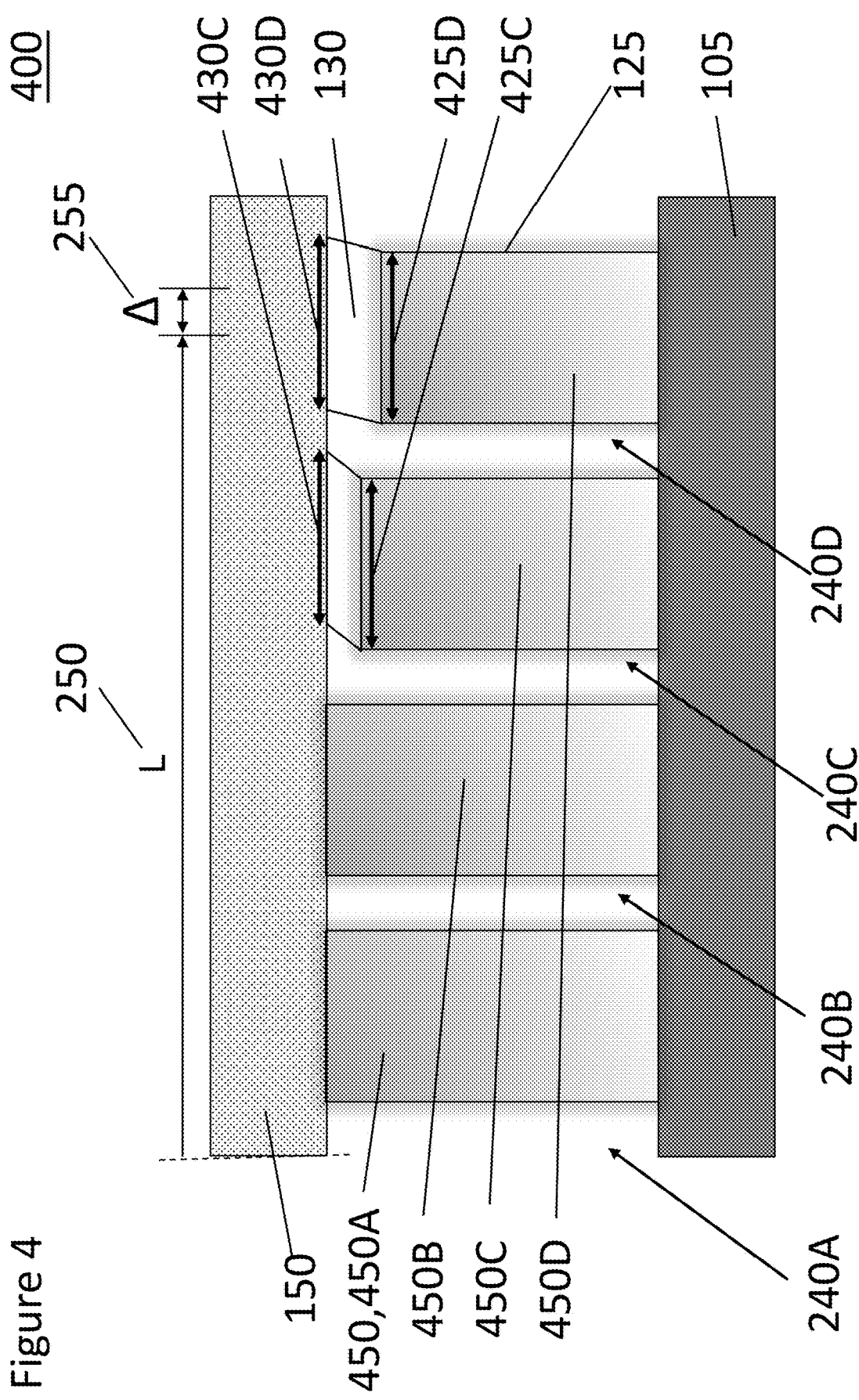
FIG. 4 is a block diagram illustration of a package showing shear strain variation due to thermal variability in the subassemblies.

FIG. 4 is a block diagram illustration of a package 400 showing shear variation due to thermal variability in the subassemblies 140.

A shear profile, typically 450, is the measure of shear at each cross-sectional plane of the subassembly 140 along the direction from substrate 105 to cold plate 150. The subassembly 240A has a shear profile 450A in the direction from the substrate 105 to the cold plate 150. In like manner subassembly 240B, 240C, and 240D have shear profiles 450B, 450C, and 450D, respectively.

The shear profiles 450 in the subassemblies 140 are created by the differential expansion 255 of the length, L, 250 of the cold plate 150 with respect to the differential expansion of the substrate 105. The differential expansion 255 of the cold plate 150 can be in a different direction and magnitude at any point on the cold plate 150 surface as can the differential expansion of the substrate 105 at any point on the substrate surface. The differential expansion 255 is influenced by the heat flux 160 through each of the subassemblies 140. Because of the temperature profile differences explained above, the differential expansion 255 within each subassembly 140 can be difficult to predict. This unpredictability is hard to address in package 400 design.

As a non-limiting, illustrative example, the TIM component 130 in subassembly 240C in a particular operating state has a shear shown as 430C at the TIM 130 interface with the cold plate 150 and a shear shown as 425C at the TIM 130 interface with the temperature and strain sensitive 125 component. The TIM component 130 in subassembly 240D in the same operating state has a shear shown as 430D at the TIM 130 interface with the cold plate 150 and a shear shown as 425D at the TIM 130 interface with the temperature and strain sensitive 125 component. These shears (425C, 425D, 430C, and 430D) usually are different and change differently due to operational variances and component size and property differences. These shears can affect the entire shear profile 450 of the respective subassemblies 140.

The shears and changes in shear throughout the subassemblies 140 in the package 400 can make components 135 perform non-uniformly and less reliably and can disconnect electrical connections in and between the processor 115, FR4 110, and substrate 105.

Figure 5:
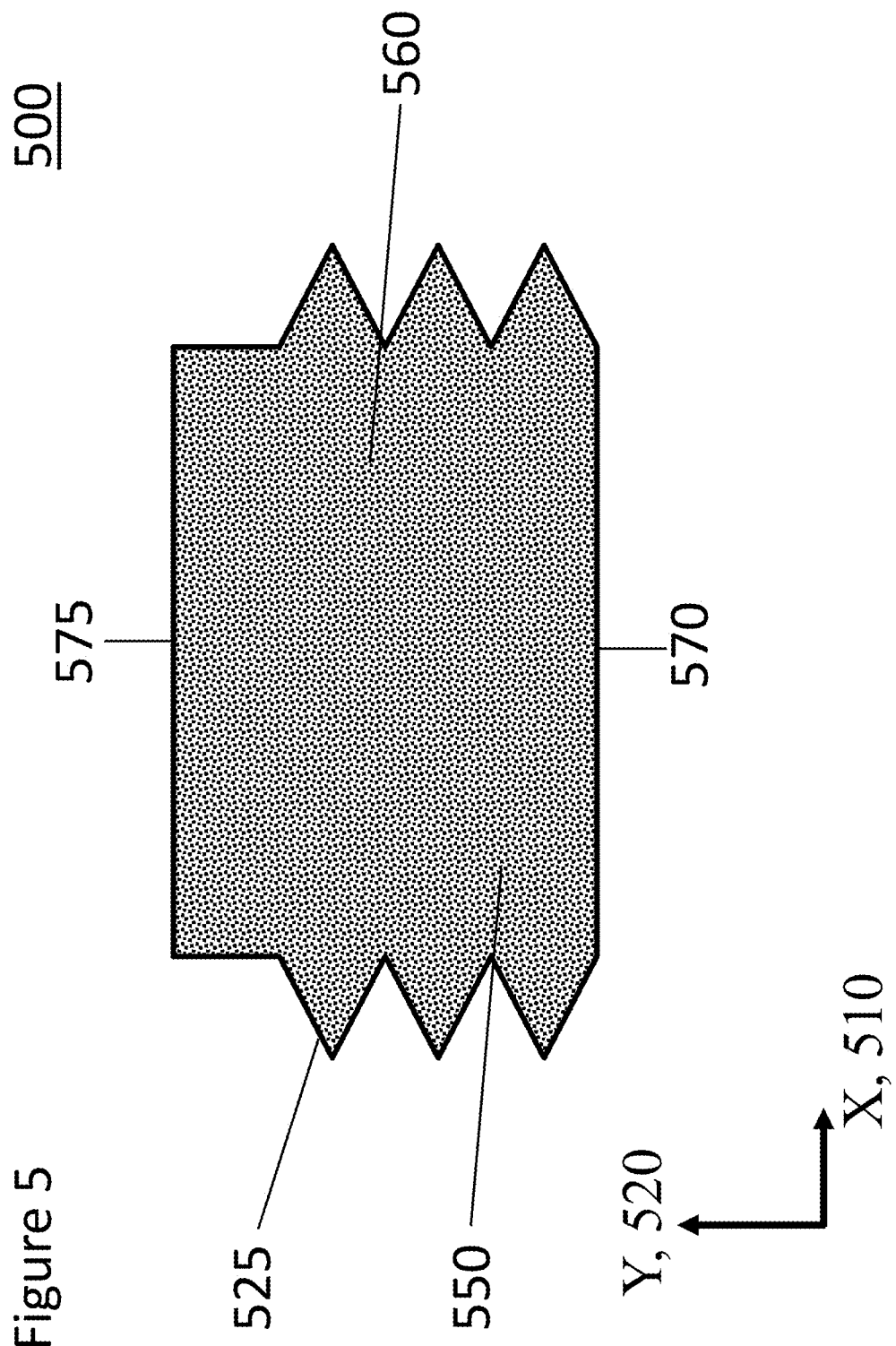
FIG. 5 is a block diagram of an embodiment of an encapsulated liquid thermal interface (LTI).

FIG. 5 is a block diagram of an embodiment of an encapsulated liquid thermal interface (LTI) 500.

The LTI 500 is a flexible receptacle that contains a fluid 550 with a high heat conductivity, e.g. a fluid with a high value of thermal conductivity, k. A flexible housing 525 contains the fluid 550. The housing 525 is capable of deforming in the vertical, Y-direction 520, in response to stress in a subassembly 140, and in the horizontal, X-direction 510, in response to strain in the subassemblies 140. In some embodiments, when the LTIs 500 replace the TIMs 130 in the subassemblies 140, heat is conducted from the subassemblies 140 through the LTIs 500 to the cold plate 150 while the LTIs 500 maintain a constant stress on all subassemblies 140 and minimize the strain on the subassemblies from the differential expansion 255 of the cold plate 150.

Using the LTIs 500, the subassemblies 140 each experience a uniform and approximately equal normal load and stress, independent of manufacturing height, material, or thickness differences of the components 135. In some embodiments, the total amount of stress experienced by each of the assemblies 140 is also controlled, as described below. This level of stress control is enabled despite fluctuations in temperature and heat flow 160.

While the LTI 500 fluid 550 is not in motion, e.g. in most steady state operating conditions, the LTI 500 as a fluid media will not transmit shear force. For instance, the shear caused by the differential expansion 255 of the cold plate 150 will not be experienced by the components 135 below the LTIs 500 in the subassemblies 140. In addition, while forces/pressure in the Y-direction causing stress in the subassembly 140 easily transmits through the LTI, some of the energy of this pressure is absorbed in the bulk volume of the LTI 500 and cushioned by the spring constant of the housing 525.

The fluid 550 is encapsulated in an LTI volume 560 in the flexible housing 525 to withstand imposed pressure. The housing 525 is strong enough to withstand the maximum pressure the fluid 550 will experience along with any movement of the housing 525 caused by the stresses and strains imposed.

In some embodiments the fluid 550 is a liquid thermal interface (LTI) material including but not limited to thermal grease, a thermal gel, Mercury (chemical symbol Hg), and Gallium combined with Indium (also called liquid metal).

In some embodiments, the housing 525 is made from a thin metallic membrane and formed into the shape of a bellows by preforming the metal container so the bellows would expand under fluid pressure to keep the thermal interfaces at 570 and 575 in close contact with adjoining surfaces. Metals used for the metallic membrane include copper, copper alloys, stainless steel and any other thermally conducting material that is also flexible or ductile (in contrast to being brittle) and range in thickness between 1 mil and 10 mil. In some embodiments, the bellows is coated with appropriate material to avoid chemical interaction with fluid LTI 550. A thin second layer of TIM-paste can be applied between the housing 525 bottom 570 and the contact surface of each of the subassemblies 140. The housing 525 has a housing opening 575 in fluid communication with the housing volume 560 of fluid 550.

Figure 6:
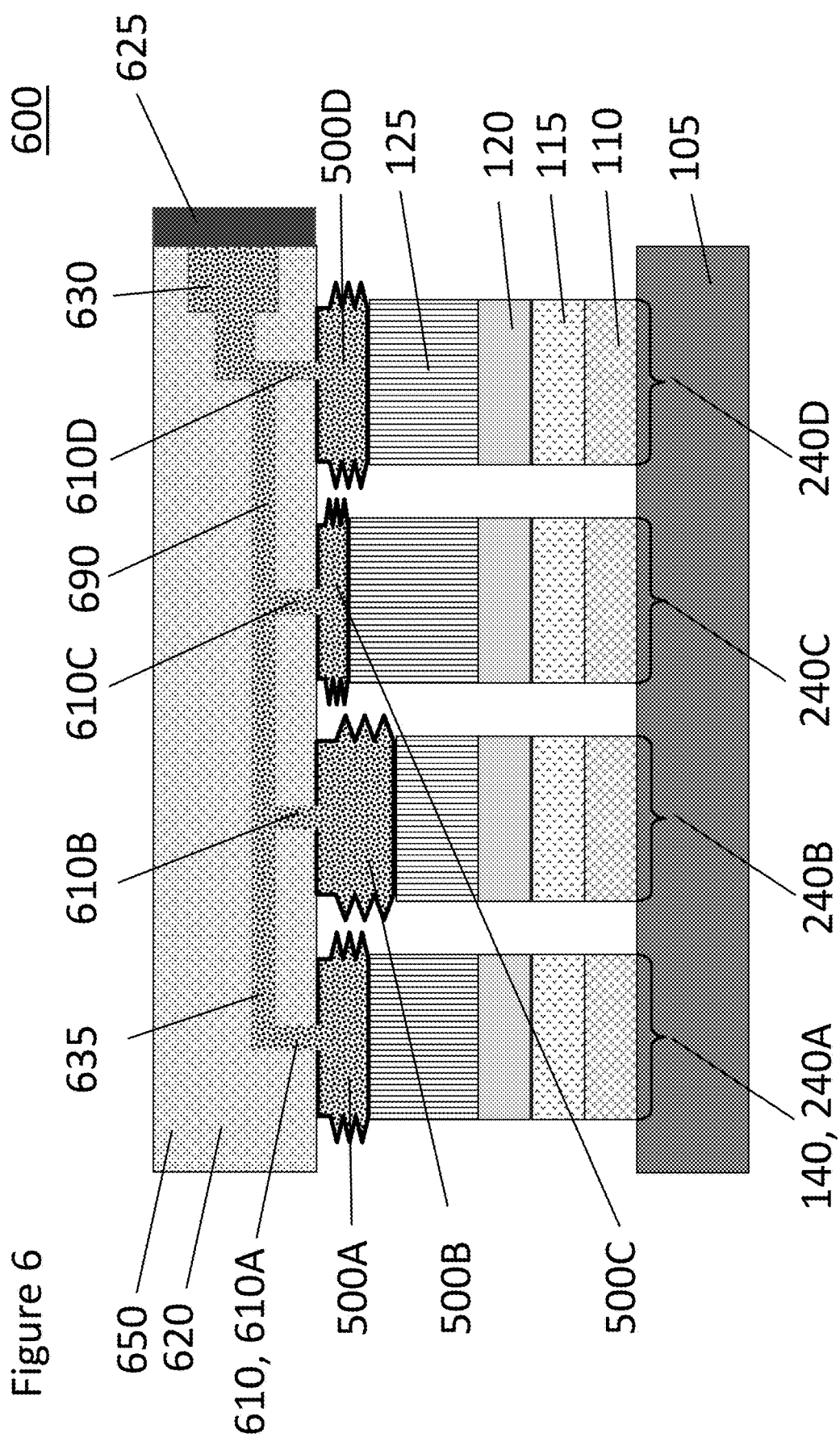
FIG. 6 is a block diagram of a package showing one embodiment of the cold plate with a pressure passage, a pressure generating assembly, pressure connections, and embodiments of encapsulated liquid thermal interfaces (LTIs).

FIG. 6 is a block diagram of a package 600 showing one embodiment of the cold plate 650 made of a thermal conductive cold plate substrate 620. Within the cold plate substrate 620 is a pressure header 630 and a pressure passage 635. Individual pressure connections (610A, 610B, 610C, and 610D, typically 610) each connect to embodiments of encapsulated LTIs (500A, 500B, 500C, and 500D, respectively, through a housing opening 575). In some embodiments a pressure generating assembly 625 controls the system pressure 690 within the pressure header 630, pressure passage 635, pressure connections 610, and housing volumes 560. In some embodiments, the cold plate substrate 620 is made of a metal including as a non-limiting example copper (Cu), aluminum (Al), nickel (Ni), and alloys thereof.

In some embodiments, each LTI 500 has a metallic membrane with a bellows shape as a housing 525 which contains an LTI fluid material 550. The housing 525 expands/contracts to fill the variable thicknesses (230A, 230B, 230C, and 230D, typically 230) of each of the TIM 130 components 135 of the subassemblies 140 laid out in the array in the package 600. Each of the housings 525 expands and contracts as the thicknesses 230 of the TIM 130 change for each subassembly 140 during package 600 operation and commensurate temperature fluctuations. In addition, the fluid 550 and the housing 525 move in each LTI 500 as strain is applied to each of the respective subassemblies 140 due to differential expansion 255 of the cold plate 650. Accordingly, the strain each of the subassemblies 140 experience due to differential expansion 255 in greatly minimized.

In some embodiments, each of the LTIs 500 is connected so that the LTI fluid material 550 is fluidly connected to an individual pressure connection 610, e.g. through the housing opening 575. Each pressure connection 610 is in fluid communication with the pressure passage 635 which in turn is in fluid communication with the pressure header 630. By fluid communication is meant that the LTI fluid material 550 can freely flow between the pressure header 630, pressure passage 635, each of the pressure connections (610A, 610B, 610C, and 610D, typically 610), and the LTI fluid material in each LTI 500 (500A, 500B, 500C, and 500D, respectively) volume 525 without an appreciable change in pressure on the fluid material 550 due to any connection. Accordingly, a system pressure in the system is constant, at least in steady state, and therefore the pressure exerted in the Y-direction 520 on each of the subassemblies 140 is equalized throughout the LTI fluid material 550. The result is that while the LTIs 500 may expand and contract as the thicknesses 230 of the individual TIM 130 locations change, the pressure and therefore the stress exerted on each of the subassemblies 140 will be equal and controlled.

In some embodiments this system pressure 690 is set and controlled and can be preloaded by different embodiments of a pressure generating assembly 625. In some embodiments, the preloaded system pressure 690 is a minimum pressure to maintain good electrical connections.

Figure 7:
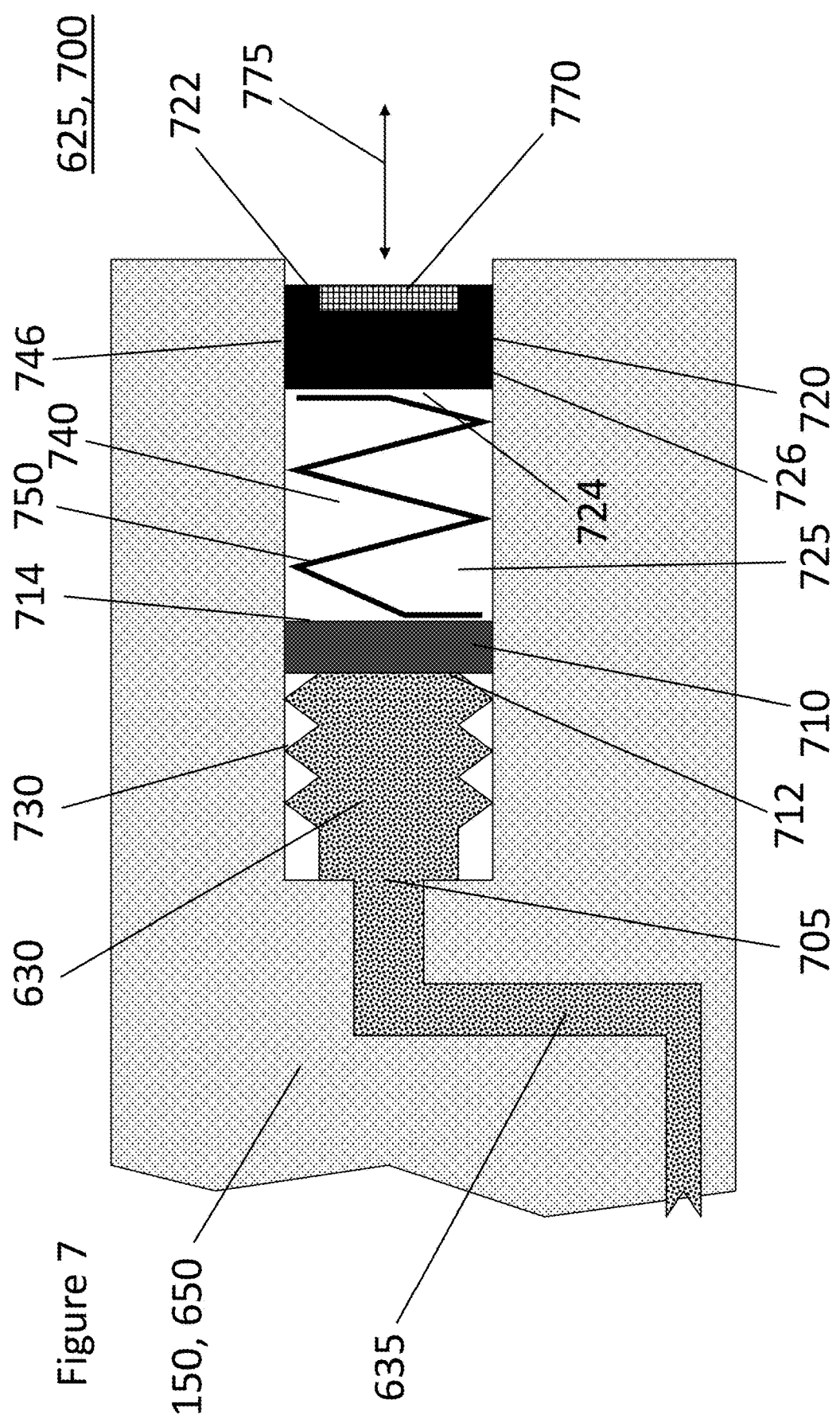
FIG. 7 shows a block diagram of one embodiment of a manually adjustable pressure generating assembly.

FIG. 7 shows a block diagram of one embodiment 700 of a manually adjustable pressure generating assembly (625, 700).

In this embodiment, the pressure header 630 is an assembly bellows 730 with an assembly bellows opening 705 in fluid communication with the pressure passage 635. The assembly bellows 730 can deform in an axial direction 775 within a chamber 740. The chamber 740 constrains the assembly bellows 730 from moving in any direction other than axially 775. In some embodiments, the assembly bellows 730 can be made of a thin metallic membrane as are some of the LTIs 500 described above.

An axially movable plate 710 is also constrained within the chamber 740 so the axially movable plate 710 can only move in the axial direction 775 within the chamber 740. A bellows side 712 of the axially movable plate 710 contacts and applies a force to a surface of the assembly bellows 730 so that the assembly bellows 730 deforms in response to the applied force. As the applied force changes in the axial direction 775, the deformation of the assembly bellows 730 causes the volume of the fluid 550 within the pressure header 630 to change. The pressure transmitted by the fluid 550 within the pressure header 630 will also change. In typically embodiments, the axially movable plate 710 contacts an opposite side of the assembly bellows 730 from the assembly bellows opening 705.

An adjustment plate 720 is also constrained within the chamber 740 so the adjustment plate 720 can only move in the axial direction 775 within the chamber 740. In some embodiments an external circumference 726 of the adjustment plate 720 is threaded and engages with threads on the internal surface 746 of the chamber 740 so that the adjustment plate 720 can be screwed into or out 775 of the chamber 740. In some embodiments, an external fitting 770 is part of and/or affixed to an exterior surface 722 of the adjustment plate 720. Manipulating, e.g. turning, the external fitting 770 causes the adjustment plate 720 to axially move into and out 775 of the chamber 740.

The chamber also encloses a spring 750 which the chamber constrains to compress and expand in the axial direction 775. An internal surface 724 of the adjustment plate 720 applies an axial 775 force on the spring 750 as the adjustment plate 720 axially 775 moves in and out of the chamber 740. The spring 750 transmits the force to a spring side 714 of the axially movable plate 710 which in turn applies the force to a surface of the assembly bellows 730. Therefore, by adjusting the axial position of the adjustment plate 720 the spring 750 force (spring tension) causes the hydraulic/system pressure in the fluid 550 of the system to be adjusted and maintained.

Figure 8:
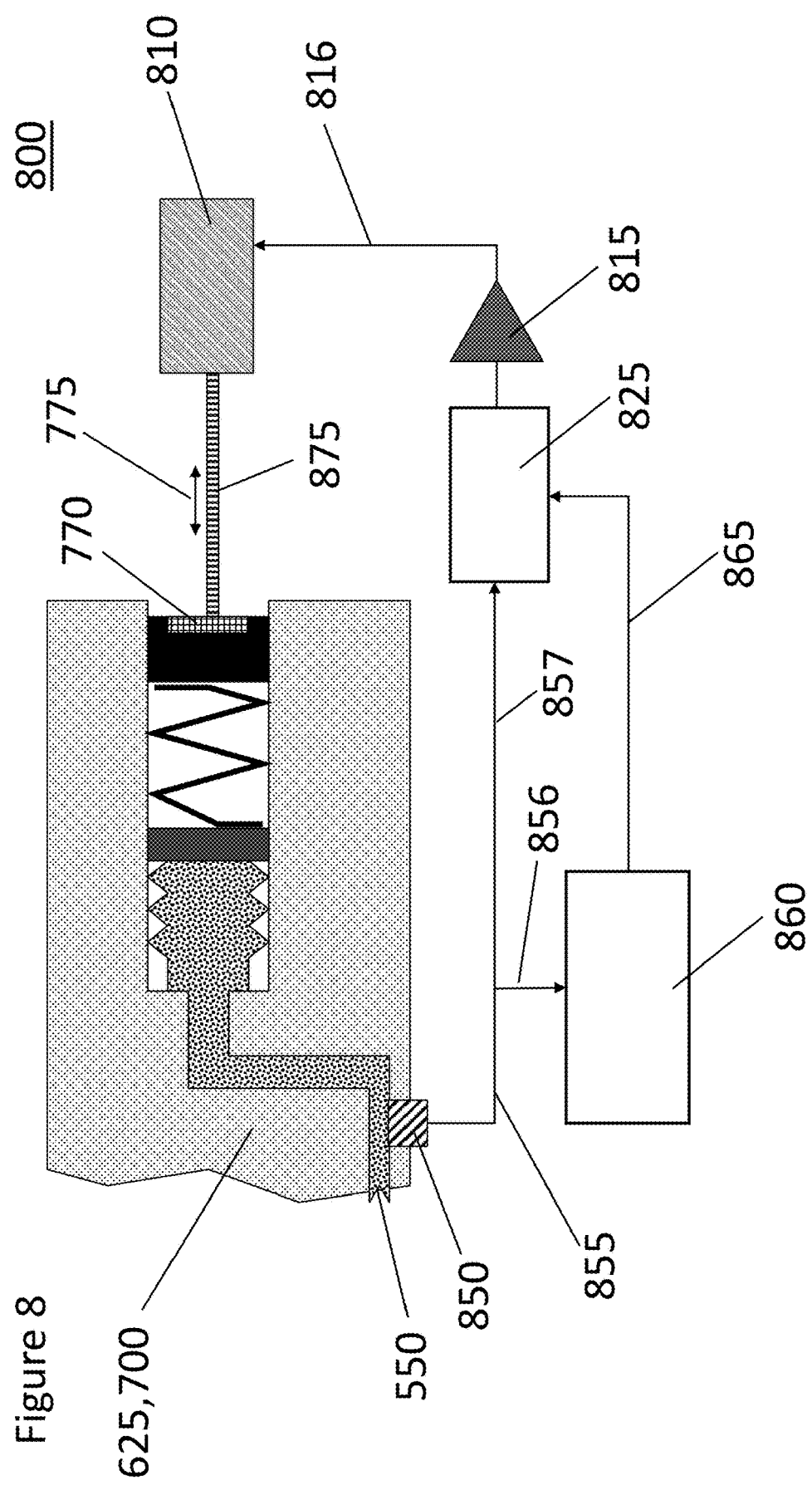
FIG. 8 is a block diagram of one embodiment showing a control system automatically operating the pressure generating assembly.

FIG. 8 is a block diagram of an alternative embodiment 800 showing a control system automatically operating the pressure generating assembly (625, 800).

In one embodiment, the external fitting 770 is moved, e.g. in an axial direction 775, by a positioning rod 875 turned by a driver 810. The driver 810 is controlled by a driver signal 816 from a control output 815. One or more pressure sensors 850 monitor the system pressure 690 of the system fluid 550 at one or more points in the fluid system, e.g. at the pressure header 630 or the pressure passage 635. In some embodiments, the pressure sensor(s) 850 send a pressure signal 855 to a pressure control system 860 and a feedback controller 825. The pressure control system 860 uses the system pressure signal (855, 856) to determine the operating conditions of the subassemblies 140 and the package (e.g. 100) and what the system pressure 690 should be for optimal performance. The pressure control system provides a set point pressure signal 865 representing the desired system fluid 550 pressure to the feedback controller 825.

The feedback controller takes as input the set point pressure signal 865 and the sensor 850 measured system pressure signal (855, 857) to determine a pressure control signal 816 that the control output 815 provides 816 to the driver 810. The driver 810 drives the positioning rod 875 to cause the adjustable pressure generating assembly (625, 700) to bring the system pressure 690 to the setpoint pressure.

Figure 9:
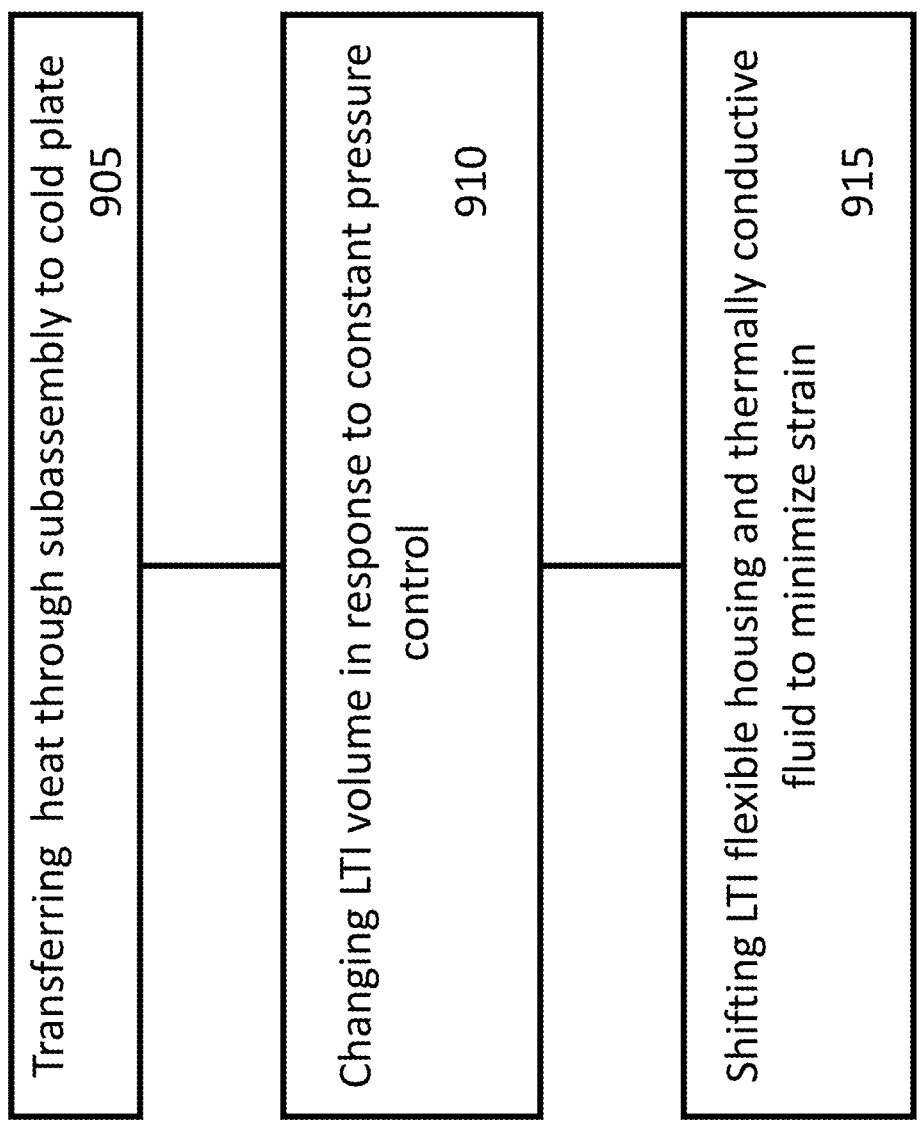
FIG. 9 is a flow chart of a method of controlling stress and strain in a package of subassemblies.

FIG. 9 is a flow chart of a method of controlling stress and strain 900 in a package of subassemblies 140.

Method 900 begins with transferring heat generated in one or more of the subassemblies 140, through each respective subassembly/component (140, 135) through a liquid thermal interface (LTI) 500, and to the cold plate 650. The heat is transferred through the flexible housing 525 and the thermally conductive fluid 550 that passes through the housing opening 575 and the pressure passage 635 to the pressure header 630 and other locations on the cold plate 650.

In step 910, the LTI 500 expands and contracts in the vertical, Y-direction to change the LTI volume 560 and in response to controlling the pressure of the thermally conductive fluid 550 and equal the system pressure 690. Maintaining the system pressure 690 constant also maintains the stress on the subassemblies 140 constant.

In step 915 minimizes the strain on the subassemblies 140 because the housing 525 is flexible in the Y-direction (direction of the forces causing strain, e.g. forces in the horizontal direction) and the thermally conductive fluid 550 does not support strain when not in motion.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

We claim:

1. A cold plate used to cool an electronic package, the electronic package having one or more subassemblies, the cold plate comprising:
    a thermally conductive cold plate substrate;
    a pressure header within the cold plate substrate;
    a pressure passage within the cold plate substrate;
    one or more pressure connections being within the cold plate;
    an encapsulated liquid thermal interface (LTI) connected to each of the pressure connections, being a respective pressure connection, each of the LTIs having a flexible housing with a housing bottom and the LTI encapsulating an LTI volume;
    a hydraulic pressure generating assembly;
    a liquid thermal interface (LTI) fluid material filling the pressure header, the pressure passage, each of the respective pressure connections, the LTI volumes, and hydraulic pressure generating assembly,
    wherein the pressure header, the pressure passage, each of the respective pressure connections, the LTI volumes and the hydraulic pressure generating assembly are in fluid communication,
    wherein the hydraulic pressure generating assembly controls a hydraulic/system pressure transmitted through the LTI fluid material,
    wherein each of the housing bottoms is in physical and thermal contact with a top surface of one of the subassemblies,
    wherein the flexible housing of the LTI deforms in a vertical direction in response to a stress in the vertical direction and deforms in a horizontal direction in response to a strain in the horizontal direction, and
    wherein the housing bottoms cause a constant and equal stress to be maintained on all the subassemblies that minimizes strain on the subassemblies.

2. The cold plate, as in claim 1, where the LTI fluid material is one or more of the following: a thermal grease, a thermal gel, Mercury, and Gallium combined with Indium.

3. The cold plate, as in claim 1, where the hydraulic pressure generating assembly comprises:
    an assembly bellows that is the pressure header; and
    a movable plate that applies a force to the LTI fluid material in the assembly bellows.

4. The cold plate, as in claim 3, where the force is applied by a manual adjustment and the force creates the hydraulic/system pressure.

5. The cold plate, as in claim 4, where the manual adjustment comprises:
    a chamber;
    a spring within the chamber; and
    an adjustment plate axially movable within the chamber, wherein the adjustable plate axially moves within the chamber to apply a force to the spring which in turn applies a force to the movable plate and adjusts the hydraulic/system pressure.

6. The cold plate, as in claim 3, where the force is applied by an automatic adjustment.

7. The cold plate, as in claim 6, where the automatic adjustment is controlled by a driver which adjusts the hydraulic/system pressure to a set point pressure determined by a pressure control system.

8. The cold plate, as in claim 1, where one or more of the LTIs is physically connected to a subassembly in an electronic package so that the LTI controls a pressure and minimizes a shear on the subassembly to which the LTI is physically connected.

9. The cold plate, as in claim 1, where there are one or more respective subassemblies in an array in the electronic package and where each respective subassembly is physically attached to one of the LTIs, being a respective LTI, the respective LTI controlling a pressure and minimizing a shear on the respective subassembly to which the respective LTI is physically connected and wherein each respective LTI, the pressure connections, the pressure header, and the pressure passage are filled with the liquid thermal interface (LTI) fluid material and wherein the flexible housing of the LTIs is a bellows.

10. The cold plate, as in claim 9, where the thermally conductive cold plate substrate is made of one or more of the following: a metal, a metal alloy, copper (Cu), aluminum (Al), nickel (Ni), an alloy of Cu, an alloy of Al, and an alloy of Ni.

11. The cold plate, as in claim 9, where each of the respective LTIs is connected to and is in fluid communication with a respective pressure connection.

12. The cold plate, as in claim 11, where each respective pressure connection is connected to the pressure passage, the pressure passage being connected to the pressure header, the respective pressure connection, the pressure passage, and pressure header being within the cold plate substrate.

13. The cold plate, as in claim 12, where all the respective LTIs, all the respective pressure connections, the pressure passage, and pressure header are in fluid communication and at the hydraulic/system pressure.

14. The cold plate, as in claim 13, where the hydraulic/system pressure is a preloaded system pressure.

15. The cold plate, as in claim 14, where the preloaded system pressure is high enough to maintain a minimum pressure to maintain a good electrical connection between each of the respective assemblies and one or more connections on the bottom substrate of the electronic package.

16. The cold plate, as in claim 1, wherein the pressure generating assembly controls the hydraulic/system pressure to a set point pressure by a pressure control system.

* * * * *